United States Patent [19]

Rahn et al.

[11] Patent Number: 4,666,077
[45] Date of Patent: May 19, 1987

[54] SOLDER POT FOR WAVE SOLDERING MACHINE

[75] Inventors: Armin Rahn, Montreal; William H. Down, Brossard; Marcel Drouin, St. Hubert; Matthew J. Rudzicz, Montreal; John F. Buszard, Ste-Anne de Bellevue; Ralph W. Woodgate, Carignan, all of Canada

[73] Assignee: Electrovert, Canada

[21] Appl. No.: 804,274

[22] Filed: Dec. 3, 1985

Related U.S. Application Data

[62] Division of Ser. No. 470,494, Feb. 28, 1983, Pat. No. 4,632,291.

[51] Int. Cl.⁴ .............................................. B23K 3/06
[52] U.S. Cl. ..................... 228/37; 228/56.1; 118/410
[58] Field of Search ............ 228/37, 56.1, 260, 180.1; 118/410

[56] References Cited

U.S. PATENT DOCUMENTS

| | | | |
|---|---|---|---|
| 3,119,363 | 1/1964 | Rieben | 228/37 |
| 3,604,611 | 9/1971 | Lamberty | 228/36 |
| 3,921,888 | 11/1975 | Elliott et al. | 228/180 |
| 4,465,014 | 8/1984 | Bajka et al. | 228/37 X |
| 4,530,457 | 7/1985 | Down | 228/180.1 |

FOREIGN PATENT DOCUMENTS 2150064 8/1985 United Kingdom .

OTHER PUBLICATIONS

Kostiek et al., "Wave Solder Chimney", *IBM Technical Disclosure Bulletin*, vol. 22, No. 9, pp. 3984-3985, Feb. 1980.
Winther: Technical Devices Company for the New Solder Machine.

*Primary Examiner*—Kenneth J. Ramsey
*Attorney, Agent, or Firm*—Darby & Darby

[57] ABSTRACT

Automatic wave solder apparatus in which printed circuit boards are passed over a wave soldering section to apply solder to exposed metallic surfaces on the undersides of the surface of the board. A weir is attached to the exit side of a discharge nozzle for the solder wave which is spring loaded upwards for engagement with a stop member. The solder pot assembly may be lowered and swung out of a circuit board conveyor path for cleaning and both front plate and rear plate members on each side of the discharge nozzle are hinged so they can be raised for cleaning when the solder pot assembly is lowered. The stop member permits the discharge nozzle to be raised to different heights, but retains the spring loaded weir at the same height.

11 Claims, 3 Drawing Figures

SOLDER POT FOR WAVE SOLDERING MACHINE

This application is a divisional application of U.S. Ser. No. 470,494 filed Feb. 28, 1983, now U.S. Pat. No. 4,632,291.

FIELD AND BACKGROUND OF THE INVENTION

This invention relates to the soldering of printed circuit boards or the like in which the boards pass over a wave soldering section.

A wave soldering machine is a machine for soldering components pre-mounted on a printed circuit board to that board. The board is held with components on the board having leads projecting down through holes in the board. Sometimes small components (chips) may be cemented to the bottom surface of the board. The board is passed over the top of a solder wave to just skim its surface. During this passage, strong, conductive solder joints have to be formed between the components and the board. A well soldered board has the following joint characteristics.

(1) All exposed copper of the board and component leads are well wetted.

(2) All joints are continuous.

(3) Solder has flowed through the holes in the PCB, partly by capillary action, to make nice through connections to the top surface of the board.

(4) There is no bridging between component leads, pads or tracks on the PCB causing a false circuit.

(5) There are no icicles of frozen solder hanging from the bottom of the board.

(6) None of the components have been damaged by the temperature of the process.

(7) There is no excessive alloying between the leads, or copper of the board and the solder.

(8) There are no inclusions or impurities in the solder.

Some of these qualities are affected by the temperature of the board when it meets the solder wave and to overcome this, the board is preferably heated prior to soldering. Another feature of these qualities is to do with the length of time the components of the board remain in the solder wave and this can partly be achieved by varying the configuration of the solder wave as well as heating the solder to the required temperature. The heating of these components has to achieve a balance between damage by thermal shock and high temperature to the board and components or excessive soldering time required to transfer heat from the solder in the solder wave to the board, thus the speed of the board passing over the solder wave also affects the configuration of the solder wave.

SUMMARY OF THE INVENTION

A solder wave is produced by pumping liquid solder from a solder pot through a nozzle. The solder pot assembly can be jacked up or down to accommodate short or long leads on the board and a special structure on the nozzle producing the solder wave ensures that, whether the solder pot assembly be up or down, the configuration of the horizontal board exit side of the wave remains at the optimum. Furthermore, the solder pot assembly can be swung out for cleaning and the nozzle structure is arranged to permit easy cleaning.

It is an object of the invention to provide an improved solder pot assembly structured for ease of maintenance and cleaning, having a wave forming nozzle adjustable for different lengths of leads on a circuit board as well as different configurations of solder waves.

The present invention provides a solder pot assembly for applying solder to exposed metallic surfaces on the undersides of circuit boards or the like, the circuit boards being conveyed in a path, the solder pot assembly comprising reservoir adapted to contain molten solder; discharge nozzle facing upwards, connected with the reservoir and having a solder outlet positioned above the reservoir, the discharge nozzle having a circuit board entry side and a circuit board exit side; means for forming a solder wave from the discharge nozzle; front plate attached to the entry side of the nozzle, establishing a contour for the solder wave flowing from the solder outlet over the front plate; and weir means attached to the exit side of the nozzle, providing for a smooth substantially horizontal or downward sloping solder stream from the solder outlet to the weir means, the weir means being spring biased upwardly for engagement with a stop member related to the path of the circuit boards.

In other embodiments, the weir means is attached to the nozzle by a back plate hingedly connected to the nozzle, the back plate biased upwardly by means of a spring. In yet another embodiment, the back plate has a lip extending over the solder outlet adjacent to the location where the back plate is hingedly connected to the nozzle, and including a spring leaf attached inside the solder outlet to seal against the lip of the back plate. The front plate may be hingedly attached to the nozzle and include an adjustable stop to locate the front plate and select the contour for the solder wave. In a still further embodiment, the front plate has a lip extending over the solder outlet, adjacent to the location where the front plate is hingedly connected to the nozzle, with a spring leaf attached inside the solder outlet to seal against the lip of the front plate.

There is also provided in the present invention a solder pot assembly for applying solder to exposed metallic surfaces on the undersides of circuit boards or the like, the circuit boards being conveyed in a path, the solder pot comprising, reservoir adapted to contain molten solder; discharge nozzle facing upwards, connected with the reservoir and having a solder outlet positioned above the reservoir, the discharge nozzle having a circuit board entry side and a circuit board exit side; means for forming a solder wave from the discharge nozzle; front plate hingedly attached to the entry side of the nozzle, establishing a contour for the solder wave flowing from the solder outlet over the front plate; weir means hingedly attached to the exit side of the nozzle, providing for a smooth substantially horizontal or downward sloping solder stream from the solder outlet to the weir means.

The weir means may be attached to the nozzle by a back plate hingedly connected to the nozzle. Furthermore, the solder pot assembly may be pivotally mounted to a post and have jacking means connected to the solder pot assembly, whereby the solder pot assembly may be raised or lowered as desired, and in the lowered position may be swung out from below the circuit board path for maintenance. The front plate and the back plate may both be pivoted upwards when the solder pot assembly is swung out in the lowered position to permit access to the reservoir for maintenance.

In a preferred embodiment, the weir means is attached to the nozzle by a back plate hingedly connected to the nozzle, the back plate being spring biased upward and the weir means engaging a stop member adjustable for height relative to the path of the circuit board. An adjustable stop may be included to locate the front plate and select the contour for the solder wave.

In a still further embodiment, there is provided a solder pot assembly for applying solder to exposed metallic surfaces on the undersides of circuit boards or the like, the circuit boards being conveyed in a path above the solder pot assembly, the solder pot assembly comprising reservoir adapted to contain molten solder; discharge nozzle facing upwards with a solder outlet positioned above the reservoir; means for forming a solder wave from the discharge nozzle; the solder pot assembly being pivotally mounted to a post and having jacking means connected to the solder pot assembly, whereby the solder pot assembly may be raised or lowered as desired, and in the lowered position may be swung out from below the circuit board path for maintenance.

DESCRIPTION OF THE PREFERRED EMBODIMENTS

The general construction of the nozzle and its mode of operation is similar to that described in U.S. Pat. No. 3,921,888 which issued on Nov. 25, 1975 to inventors Elliott and Palko and assigned to the instant assignee, the disclosure of which is hereby incorporated by reference. However, the present nozzle exhibits significant structural differences from that shown in the prior patent.

Figure 1:
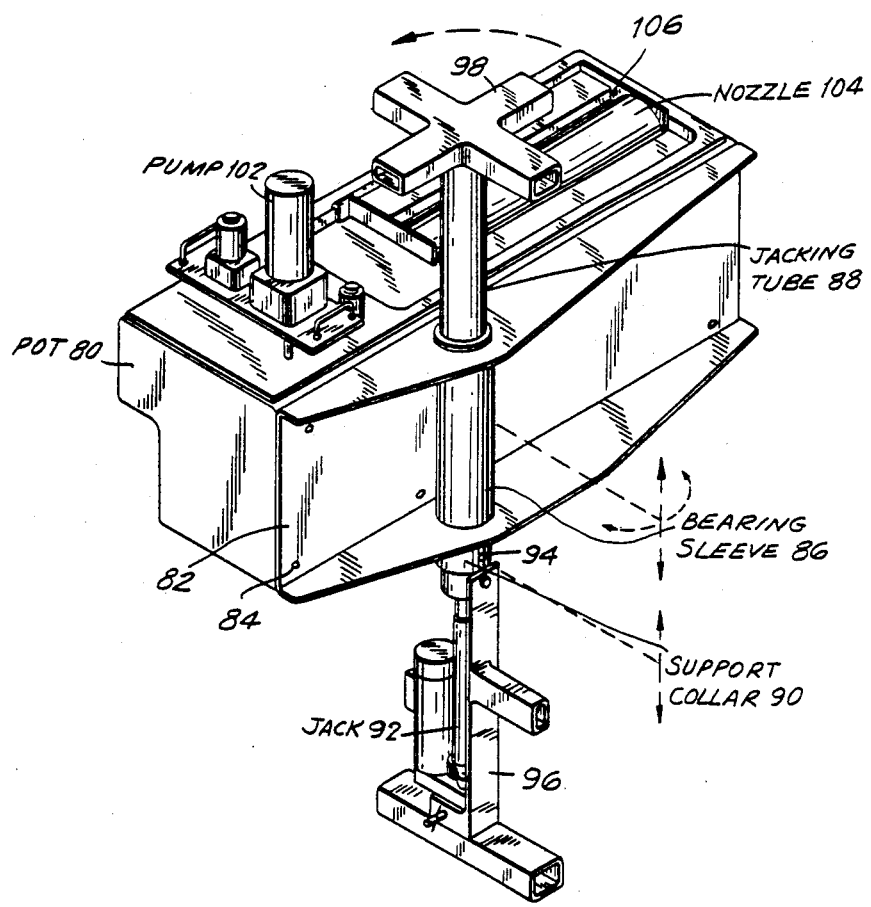
FIG. 1 is a perspective view of a solder pot assembly according to one embodiment of the present invention, illustrating a mechanism for raising and lowering the solder pot and for pivoting it in and out of the conveyor path.

The solder pot assembly is illustrated in FIG. 1 and comprises a solder pot 80 which is secured to a holder 82 by a suitable fastening means such as screw fasteners 84. Holder 82 is formed with a vertical bearing sleeve 86 which receives a jacking tube 88 extending upward from the sleeve 66. Below the sleeve 86 is a support collar 90 to which is attached a motorized screw jack 92 by means of a locking pin 94. The jack 92 is mounted on a lower frame portion 96 of the soldering machine and jacking tube 88 is secured at its upper end to an upper frame portion 98 of the soldering machine.

The solder pot 80 defines a reservoir for molten solder which is circulated by means of a pump 102 through nozzle 104. Solder wire is fed in automatically to the solder pot 80, and a heater keeps the solder molten and at the correct temperature.

As seen in FIG. 1, the nozzle 104 is formed as an elongate slot 106 extending transversely with respect to the conveyor. As may be seen more clearly in FIGS. 2 and 3, molten solder 100 from the solder pot 80 is pumped up through a main nozzle portion 108 to exit from the slot 106 where it forms a solder wave 110 flowing over a contoured front plate 112 on the circuit board entry side and back into the reservoir for recirculation. The solder exiting from slot 106 also flows in the direction of board movement, i.e. to the circuit board exit side. The flow of this rear wave 114 is kept very small by a means of a weir 116 thereby causing the surface of the rear wave 114 to move relatively slowly. The weir 116 is secured to a back plate 118 which is hingedly connected to the main nozzle portion 108 rather than rigidly connected. To effect this connection, a hinge 120 is provided. A spring metal sealing strip 122 mounted to the main nozzle portion 108 presses against a projecting lip 123 of the back plate 118 and ensures that no solder leaks between back plate 118 and the top of nozzle portion 108 through the hinge. The hinge configuration for the entry side and exit side of the nozzle is designed so that it does not freeze in one position. A compression spring 124 is secured at one end to the underside of plate 118 and is secured at its other end to a solder pot portion 126 using a bolt 128 and nut 130, the compression spring 124 biases plate 118 and weir 116 upwardly. An adjustable stop 132 projects downwardly from the conveyor frame and engages at its lower end to the upper end of weir 116.

Figure 2:
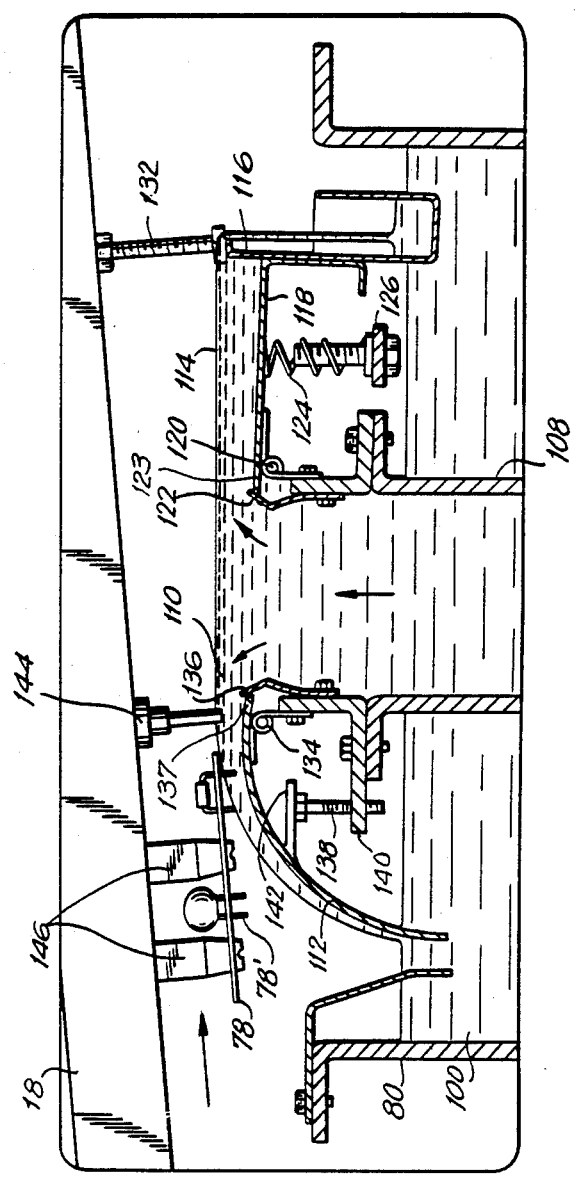
FIG. 2 is a sectional view through a solder nozzle according to one embodiment of the present invention with the solder pot assembly in a relatively high position.
Figure 3:
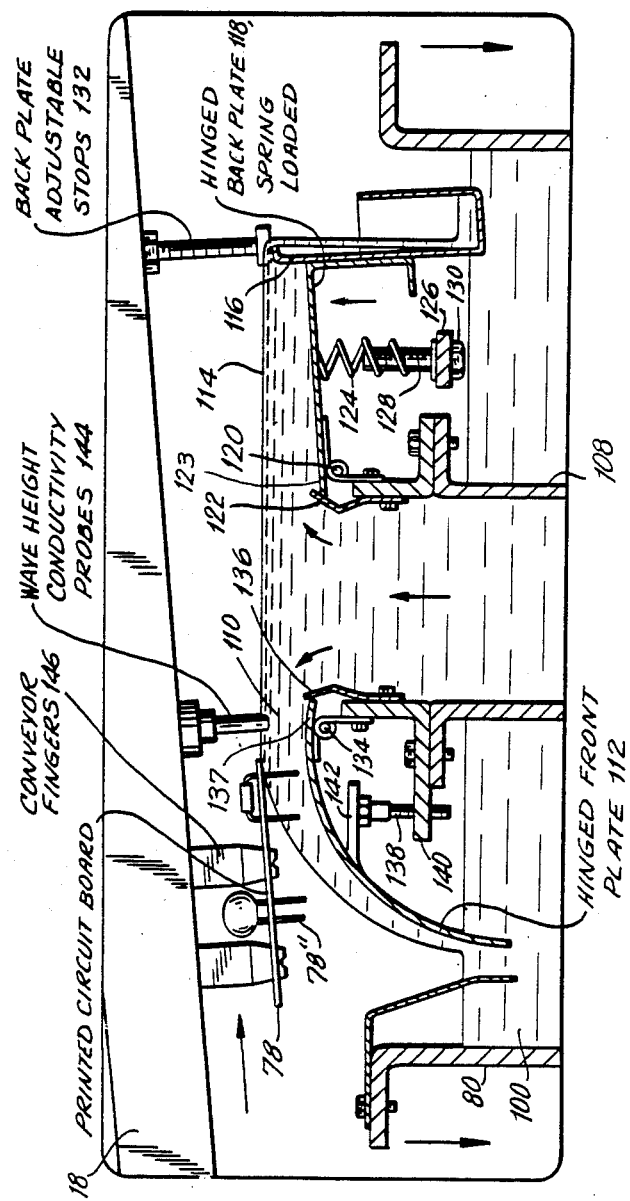
FIG. 3 is a view similar to FIG. 2 but with the solder pot assembly in a relatively low position to accomodate printed circuit boards having long pins projecting outwardly.

The contoured front plate 112 is hinged and sealed in a manner similar to that described above in relation to the back plate 118 by means of a hinge 134 and spring strip 136. The spring strip 136 presses against a projecting lip 137 of the front plate 112. A screw adjuster 138 is threadably received through a horizontally projecting portion 140 of main nozzle portion 108 and the upper end screw adjuster 138 engages the underside of member 142 extending rearwardly from the underside of the front plate 112. Also shown in FIGS. 1 and 2 is a wave height conductivity probe 144 and fingers 146 forming part of conveyor 18 and which grip the boards 78 to transport them through the soldering machine. Although a contoured front plate 112 is shown, it will be apparent to those skilled in the art that the plate need not be contoured, but may be flat for certain configurations of solder wave.

The reason for requiring the solder pot assembly to be capable of rising and descending is to accomodate circuit boards with different lengths of leads projecting from their under surface while ensuring the wave depth is kept to a minimum to provide shallow stable waves producing a minimum of dross. FIG. 2 shows a situation when the printed circuit boards 78 have short leads 78'. The top of the solder wave is set manually or sensed by sensor 44. The speed of the pump 102 can be adjusted so that the solder level is maintained. The contact time the leads 78' are in the solder wave 110 can be varied by adjusting the position of the hinged front plate 112, thus changing the configuration of the solder wave over the front plate 112. In FIG. 2, the jack 92 shows the solder pot assembly raised to a high level. It can be seen that weir 116 is held by stop 132 at a level such that there is just overflow over the weir. This, as more fully described in U.S. Pat. No. 3,921,888 is necessary for best soldering results. When the machine has to solder boards 78 having long leads 78", an adjustment to the wave depth must be made so that the leads 78" clear the nozzle. The solder pot assembly is lowered using jack 92 and to raise the solder wave height to the level it was at previously, the pump 102 is speeded up and the position of front plate 112 adjusted, thereby reaching the situation shown in FIG. 3. The spring bias of plate 118 and the cooperation of stop 132 keeps the weir 116 at the same height as before. In this way, the critical feature of ensuring a constant flow of rear wave 114 irrespective of the type of board processed is achieved automatically.

In the case when automatic control is used for soldering, a microprocessor can instruct jack 92 to raise or lower the solder pot assembly as appropriate. Slight variations in the wave depths are of no consequence provided there is clearance between the leads and the nozzle, and the top surface of the wave 110 is in the correct position with respect to the board and the height of the flow of the rear wave 114 is also correct. Screw adjuster 138 permits limited adjustment of the shape of the front portion of the wave so contact time the leads spend in the solder wave can be adjusted. With regards to maintenance and cleaning of the solder pot, easy accessability is ensured simply by lowering the solder pot assembly and swinging it out from under conveyor 18 around jacking tube 88.

In one embodiment, a swivel cam arrangement is provided at the lower end of the motorized screw jack 92, so as the solder pot assembly is lowered, it slowly swings out in a smooth motion at the lower end of the movement. The movement of the solder pot assembly is motorized, as is the swinging action, so the movement is smooth avoiding the hot molten solder sloshing out of the solder pot 80.

The nozzle does not have to be removed for cleaning; hinging the front and rear plates 112 and 118 allows them to be swung up so the solder pot 80 can be cleaned. Dross, which is tin oxide, collects on top of the molten solder and can be removed by skimming. Oil or other types of dross inhibitors may be used on the surface of the solder in solder pot 80.

When used automatically, the solder pot assembly can be moved up or down to adjust the lead length of the circuit board 78. The shorter the component leads on the board, the higher the solder pot assembly is raised. In an automatic mode, the position of the solder pot assembly is measured with a photo cell and chopper disc located on the jacking motor shaft. In the manual mode, up and down movement is toggled by the operator on a control panel. Movement override is provided by limit switches at the extremes.

Solder feed is controlled by two contact probes to provide sensing for the solder wire feeder. If the solder falls below the level of the lowest probe, the solder feed motor starts feeding. It switches off when the upper probe is reached.

In order to control the solder wave height, three contact probes are located over the solder wave to scan the wave. If the wave is below the lowest probe then the solder pump speed is increased by approximately one part in fifty every two hundred miliseconds. If the wave covers the first probe, but not the middle one, the pump speed is increased by four parts in a thousand in the same time. If the wave is between the two upper probes, no adjustment is made. If it touches the upper probe, pump speed is decreased by four parts in a thousand every two hundred milliseconds.

The solder pump is interlocked so that it cannot run if the solder temperature is below the eutectic point or if the solder pot assembly is not in the upper position. The width and height adjustments cannot be made while the conveyor is running. This is true for both the automatic and manual modes. The solder pumps cannot be started while the jacking stand motor is running and the solder feed can only run if the solder pump is running.

While a specific embodiment of the invention has been shown and described in detail to illustrate the application of the principles of the invention, it will be understood that the invention may be embodied otherwise without departing from the scope of the invention which is limited only by the following claims.

We claim:

1. A solder pot for applying solder to exposed metallic surfaces on the undersides of circuit boards carried by a conveyor up a sloping path, the solder pot being pivotally mounted to a post and having jacking means connected to the bottom of the solder pot, whereby the solder pot may be raised or lowered as desired, and, in the lowered position, may be swung out from below the conveyor for maintenance.

2. A solder pot assembly for applying solder to exposed metallic susrfaces of the undersides of circuit boards or the like, the circuit boards being conveyed in a path, the solder pot assembly comprising:
   a reservoir adapted to contain molten solder;
   a discharge nozzle facing upwards in fluid communication with the reservoir and having a solder outlet positioned above the reservoir, the discharge nozzle having a circuit board entry side and a circuit board exit side;
   means for varying a substantially vertical distance between the solder outlet and the conveyor path;
   means for forming a solder wave from the discharge nozzle;
   a front plate attached to the entry side of the nozzle, providing for a smooth substantially horizontal or downward sloping solder stream from the solder outlet to the weir means;
   means for maintaining a substantially constant spacing between the weir and the conveyor path when said assembly is in a solder applying position and the vertical distance between the solder outlet and conveyor path is varied.

3. The solder pot assembly according to claim 2 wherein the means for maintaining a substantially constant spacing between the weir and the conveyor path comprises a bias means for the weir means.

4. The solder pot assembly according to claim 3 wherein the bias means is an upward bias means.

5. The solder pot assembly as claimed in claim 2, wherein the weir means is attached to the nozzle by a back plate hingedly connected to the nozzle, the back plate biased upwardly by means of a spring.

6. The solder pot assembly as claimed in claim 5, wherein the back plate has a lip extending over the solder outlet adjacent to the location where the back plate is hingedly connected to the nozzle, and further inclusding a leaf spring attached inside the solder outlet to seal against the lip of the back plate.

7. The solder pot assembly as claimed in claim 2, wherein the front plate is hingedly attached to the nozzle and further including an adjustable stop to locate the front plate and select the contour of the solder wave.

8. The solder pot assembly as claimed in claim 7, wherein the front plate has a lip extending over the solder outlet adjacent to the location where the front plate is hingedly connected to the nozzle and further including a leaf spring attached inside the solder outlet to seal against the lip of the front plate.

9. The solder pot assembly according to claim 2 wherein the solder pot assembly is pivotally mounted to a post and further having jacking means connected to the solder pot assembly for raising and lowering the solder pot assembly as desired, said pivotal mount enabling the solder pot assembly in the lowered position to be pivoted out from below the circuit board path for maintenance.

10. The solder pot assembly according to claim 9, wherein the front plate and the back plate are both mounted so as to be pivotable upwards when the solder pot is swung out in the lowered position to permit access to the reservoir for maintenance.

11. A solder pot assembly for applying solder to exposed metallic surfaces on the undersides of circuit boards or the like, the circuit boards being conveyed in a path above the solder pot assembly, the solder pot assembly comprising:

a reservoir adapted to contain molten solder;

a discharge nozzle facing upwards with a solder outlet positioned above the reservoir;

the solder pot assembly being pivotally mounted to a post and further having jacking means connected to the solder pot assembly for raising and lowering the solder pot assembly as desired, said pivotal mount enabling the solder pot assembly in the lowered position to be pivoted out from below the circuit board path for maintenance.

* * * * *

UNITED STATES PATENT AND TRADEMARK OFFICE
CERTIFICATE OF CORRECTION

PATENT NO. : 4,666,077
DATED : May 19, 1987
INVENTOR(S) : John F. Buszard

It is certified that error appears in the above-identified patent and that said Letters Patent is hereby corrected as shown below:

Title page, item (19) "Rahn et al" should read
-- Buszard --.

Item (75) should read
-- John F. Buszard --.

Signed and Sealed this

Twenty-ninth Day of March, 1988

Attest:

DONALD J. QUIGG

*Attesting Officer*  *Commissioner of Patents and Trademarks*